United States Patent
Caudel et al.

[11] 4,145,655
[45] Mar. 20, 1979

[54] DIGITALLY TRANSMITTING TRANSCEIVER

[75] Inventors: Edward R. Caudel, Dallas; William R. Wilson, Garland, both of Tex.

[73] Assignee: Texas Instruments Incorporated, Dallas, Tex.

[21] Appl. No.: 791,611

[22] Filed: Apr. 27, 1977

[51] Int. Cl.² .............................................. H04B 1/38
[52] U.S. Cl. .................................... 325/15; 325/163
[58] Field of Search ............... 325/15, 20, 21, 25, 325/163, 67

[56] References Cited

U.S. PATENT DOCUMENTS

| | | | |
|---|---|---|---|
| 3,930,121 | 12/1975 | Mathieson | 325/163 |
| 3,983,484 | 9/1976 | Hodama | 325/21 |
| 3,991,389 | 11/1976 | Dwire | 325/163 |
| 4,008,373 | 2/1977 | Nash | 325/163 |
| 4,012,600 | 3/1977 | Warren | 179/90 B |
| 4,041,395 | 8/1977 | Hill | 325/67 |

Primary Examiner—Robert L. Griffin
Assistant Examiner—Michael A. Masinick
Attorney, Agent, or Firm—Stephen S. Sadacca; James T. Comfort; Melvin Sharp

[57] ABSTRACT

A transceiver has digital transmitting capability. The transceiver includes an antenna having an input for transmitting signals applied thereto. Signal generating means generate first and second signals having first and second frequencies, and transmission means selectively couple the first and second signals to the antenna input in response to first and second micro commands respectively. A processor receives manually chosen messages for transmission comprised of a series of binary encoded symbols. In response thereto, the processor sequentially generates for a predetermined time interval the first micro command for each one bit and the second micro command for each zero bit to be transmitted.

15 Claims, 23 Drawing Figures

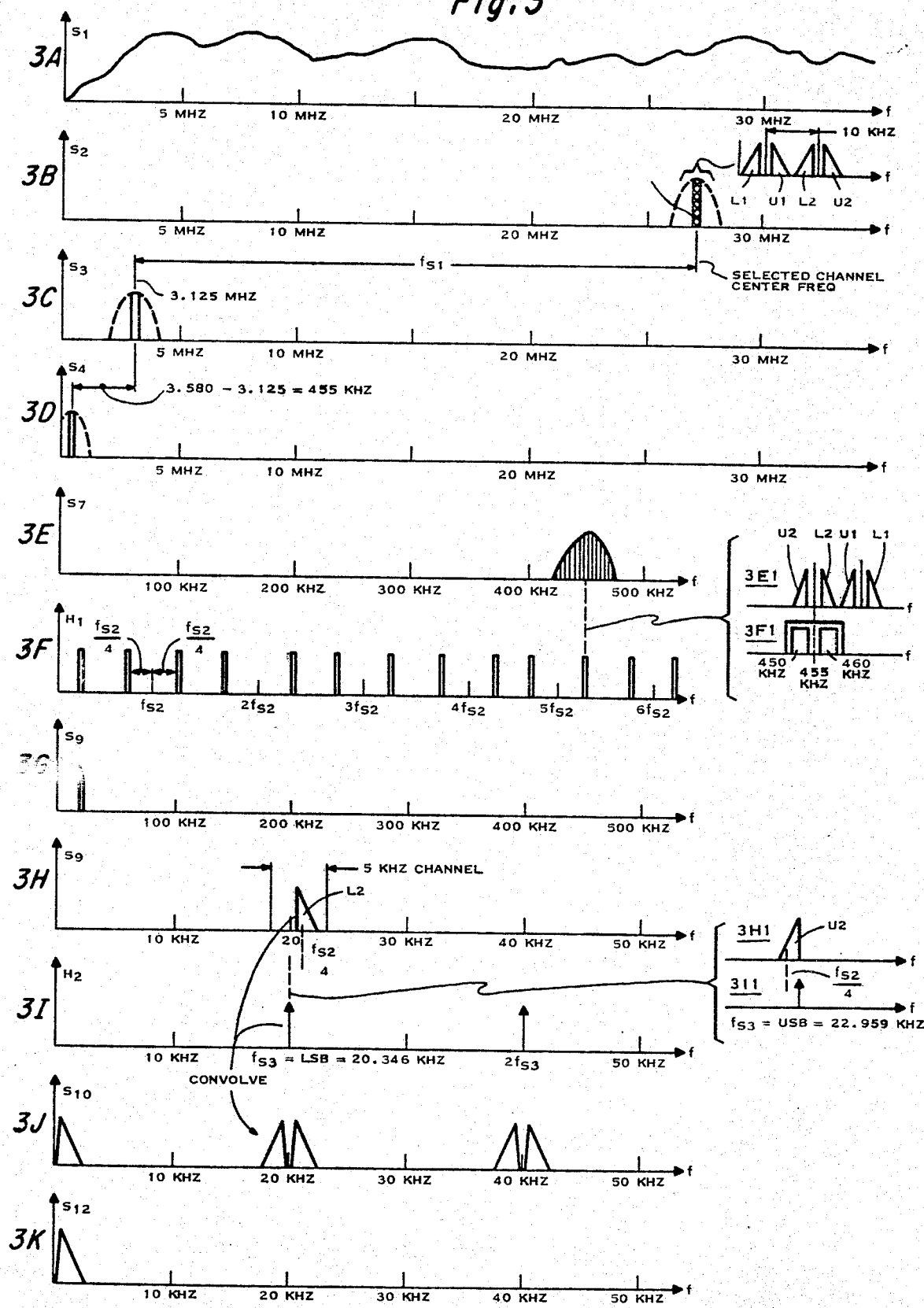

AUTO LOCK LOGIC

AUTO LOCK TIMING

Fig. 7 (TRANSMIT)

SWITCH 5200

DIGITALLY TRANSMITTING TRANSCEIVER

This invention further relates to the transceiver and components thereof described and claimed in the following U.S. patent applications filed of even date with and assigned to the assignee of the present invention: U.S. Ser. No. 791,265 entitled "A SIGNAL STRENGTH MEASURING TRANSCEIVER" by Edward R. Caudel; U.S. Ser. No. 791,629 entitled "A CLARIFYING RADIO RECEIVER" by Michael J. Cochran and Edward R. Candel; U.S. Ser. No. 791,449 entitled "AN AUTOMATICALLY CLARIFYING RADIO RECEIVER" by Michael J. Cochran and Edward R. Caudel; U.S. Ser. No. 791,254 entitled "A COMPUTER CONTROLLED RADIO SYSTEM" by Michael J. Cochran and Edward R Caudel; U.S. Ser. No. 791,450 entitled "A TRANSCEIVER WITH ONLY ONE REFERENCE FREQUENCY" by Michael J. Cochran; U.S. Ser. No. 791,614 entitled "A CHARGE TRANSFER DEVICE RADIO SYSTEM" by Michael J. Cochran; U.S. Ser. No. 791,253 entitled "A TRANSCEIVER CAPABLE OF SENSING A CLEAR CHANNEL" by Jerry D. Merryman, Michael J. Cochran and Edward R Caudel; U.S. Ser. No. 791,256 entitled "A HIGHLY SELECTIVE PROGRAMMABLE FILTER MODULE" by Michael J. Cochran and Edward R. Caudel; U.S. Ser. No. 791,616 entitled "A DUAL PROCESSOR TRANSCEIVER" by Edward R. Caudel, William R. Wilson and Thomas E. Merrow; U.S. Ser. No. 791,264 entitled "AN ELECTRONIC PHASE DETECTOR CIRCUIT" by Michael J. Cochran.

BACKGROUND OF THE INVENTION

This invention relates to analog signal processing, and more particularly to radio transceivers having digital transmission and reception capability. A transceiver has a transmit mode of operation and a receive mode. In a transmit mode, electronic signals are radiated at radio frequencies on a selectable channel. The electronic signals conventionally represent speech or musical sounds. In the receive mode, the transceiver receives radiated electronic signals from a selectable channel, frequency shifts the signals from radio frequencies back to audio frequencies, and converts the selected band to audible sounds.

In the past, transceivers have been developed which perform a selective call function. Utilizing selective call, the transmitting transceiver may automatically activate a selected one of a plurality of receiving devices without any intervention by an operator at the receiver. Thus, during one time interval, a transceiver may selectively transmit to one receiver; while during another time interval, the same transceiver may selectively transmit to another receiver.

Various schemes for implementing the selective call function have been devised. As an example, in a tone type selective call system, the transmitting transceiver broadcasts an identifying frequency prior to message transmission. Each of the receivers are preassigned a unique identifying frequency to which they are to respond. When the transmitted frequency equals the assigned frequency of a particular receiver, that receiver is turned on and receives voice transmission which follow. This type of system is described, for example, in U.S. Pat. No. 2,583,032 issued Jan. 22, 1952.

A variation of the above-described single tone selective call system is described in U.S. Pat. No. 3,771,060 issued Nov. 6, 1973. The invention therein described discloses a selective call system which utilizes a pair of simultaneously transmitted frequencies to identify a particular receiving unit. Both of the above-described selective call systems, however, can only operate with a limited number of remote receivers. This is because the identifying frequencies must be spaced far enough apart to be clearly distinguishable. Otherwise, some receivers will misinterpret the identifying tones of other receives as being their own. And only a limited number of identifying tones will fit into a particular channel.

Digital selective call systems have been developed to permit larger numbers of receiving units in a selective call system. In a digital system, one frequency is interpreted as a logical "1" value while another frequency is interpreted as a logical "0" value. Each of the receiving units are assigned a unique number which is represented by a sequence of the "1" and "0" frequencies. Such a sequence is broadcast in order to selectively call the particular unit. Digital selective call receivers are described, for example, in U.S. Pat. No. 3,336,444 issued Aug. 15, 1967, and U.S. Pat. No. 3,984,775 issued Oct. 5, 1976.

An undesirable aspect of prior art digital selective call systems, however, is that unique hardware is required in each receiving unit. That is, the hardware in each receiver must be specifically configured to recognize its preassigned call number. Further, the devices are inflexible in that the assigned call numbers are fixed. Additionally, the receivers are not suitable for mass production since unique circuitry is required in each receiver. For example, the receiver of U.S. Pat. No. 3,336,444 requires a unique local sign generator; and the receiver of U.S. Pat. No. 3,984,775 requires a unique decoding matrix. Additionally, prior digital selective call systems are not able to assign different selective call numbers to each channel on which it receives messages. Further, the prior art does not disclose apparatus for receivng digital control messages in addition to a selective call number. Such digital control messages may be utilized to remotely control devices such as a stereo, a television, or house lighting.

Accordingly, it is one object of the invention to provide a radio system having improved selective call capability.

It is another object of the invention to provide a radio system having selective call capability which includes no unique hardware.

Another object of the invention is to provide a radio system having selection call numbers which are easily modifiable.

It is another object of the invention to provide a radio system capable of assigning different selective call numbers to several channels.

Still another object of the invention is to provide a radio receiver for receiving selective call numbers in combination with subsequent digital control signals.

SUMMARY OF THE INVENTION

These and other objectives are accomplished in accordance with the invention by a radio system having digital transmitting and digital receiving capability. The transceiver includes an antenna having an input for transmitting signals applied thereto. Also, included are signal generating means for generating first and second signals of a first and second frequency respectively.

Transmission means selectively couple the first and second signals to the antenna input in response to first and second microcommands. The transceiver further includes a microprocessor having inputs coupled to receive manually chosen call numbers and digital control messages for transmission. The processor converts the call numbers and messages to binary and generates micro-command sequence, indicating their "1" and "0" bit pattern. The receiving portion of the transceiver includes frequency measuring means coupled to the antenna. The frequency measuring means generates logic signal sequences indicating the first and second frequency sequence being transmitted. The microprocessor has inputs coupled to receive the logic signals for comparing their sequence to call numbers stored in its memory. The call numbers are assigned by an operator via a keyboard. If a match occurs, the processor either actuates a predetermined function, or receives additional digital signals indicating a particular function to be performed.

DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in reference to the accompanying drawings; wherein:

FIG. 3 is comprised of a set of GRAPHS 3A-3K containing frequency diagrams of signals in the frequency domain which are present at various points on the receive signal path of FIG. 2.

DETAILED DESCRIPTION OF SPECIFIC EMBODIMENTS

Figure 1:
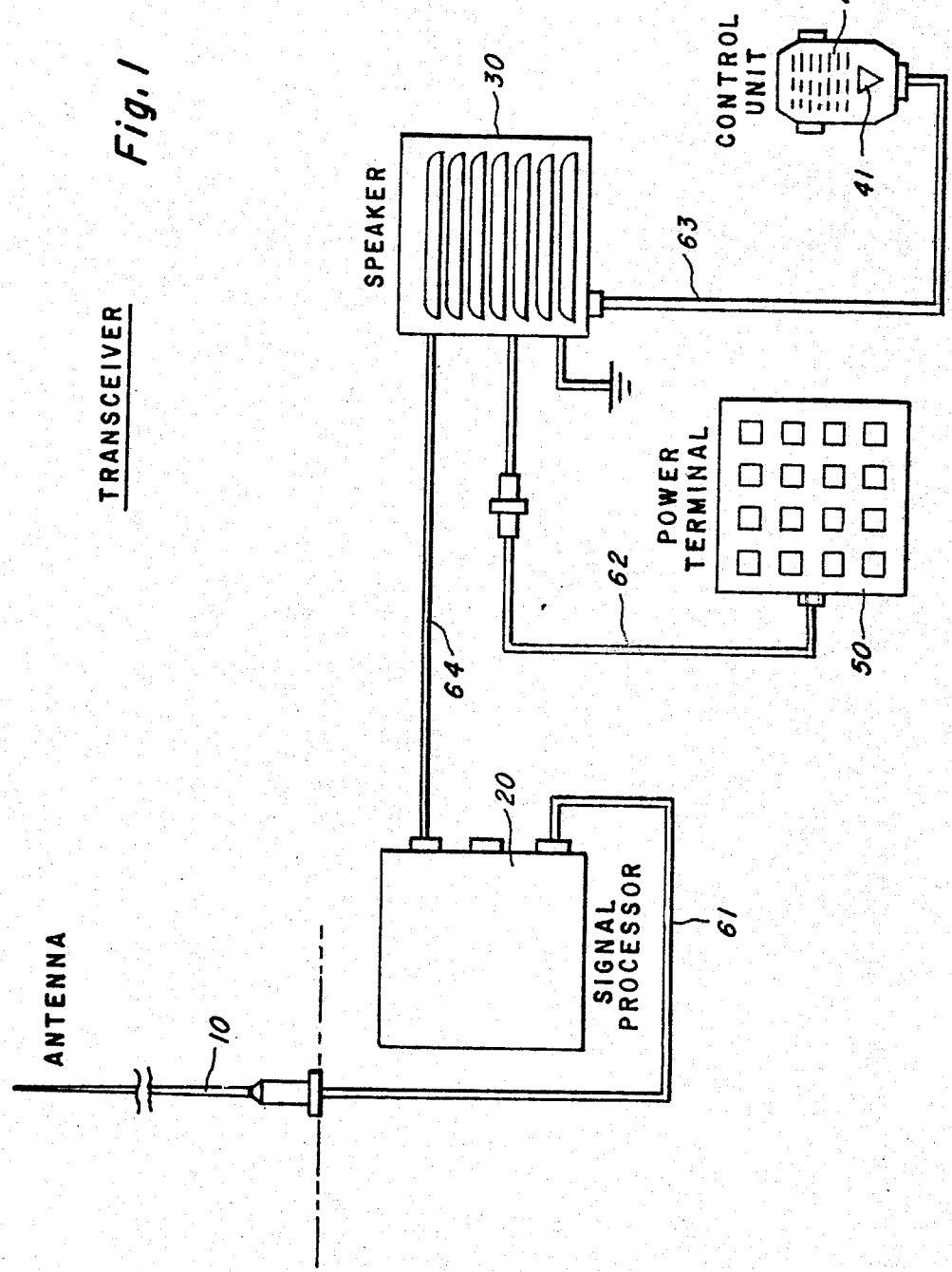
FIG. 1 is a block diagram illustrating the major components of a transceiver constructed according to the invention.

Referring now to FIG. 1, a block diagram illustrating the major components of a transceiver which is constructed according to the invention is illustrated. The transceiver is comprised of an antenna 10, a signal processing unit 20, a speaker 30, a control unit 40, and a power terminal 50. These components are electrically intercoupled by conductive cables 61-64 as illustrated in FIG. 1.

The transceiver of FIG. 1 has a transmit mode of operation and a receive mode of operation. Basically, in the transmit mode the operator speaks into a microphone 41 contained in control unit 40, and the audio signals are therein converted to electrical signals which are sent to analog signal processor 20 over cables 63 and 64. Signal processor 20 frequency shifts the received signal from an audio frequency to a frequency band of a selectable high frequency channel. The selected channel may be either a single sideband channel of approximately 5-kHz bandwidth, or an amplitude modulated channel of approximately 10 kHz. In either case the frequency shifted signals are sent via cable 61 to antenna 10 and therein transmitted via radiation.

In the receive mode, antenna 10 receives radiated electrical signals comprised of a plurality of frequency bands lying respectively within a plurality of non-overlapping frequency channels. The plurality of frequency bands are sent to signals processor 20 via cable 61. Signal processor 20 filters a selectable band from the plurality of bands, and down shifts in frequency the selected band to an audible frequency range. The selected down shifted frequency band is sent to speaker 30 via cable 64 where it is therein converted to audible sounds.

Figure 2:
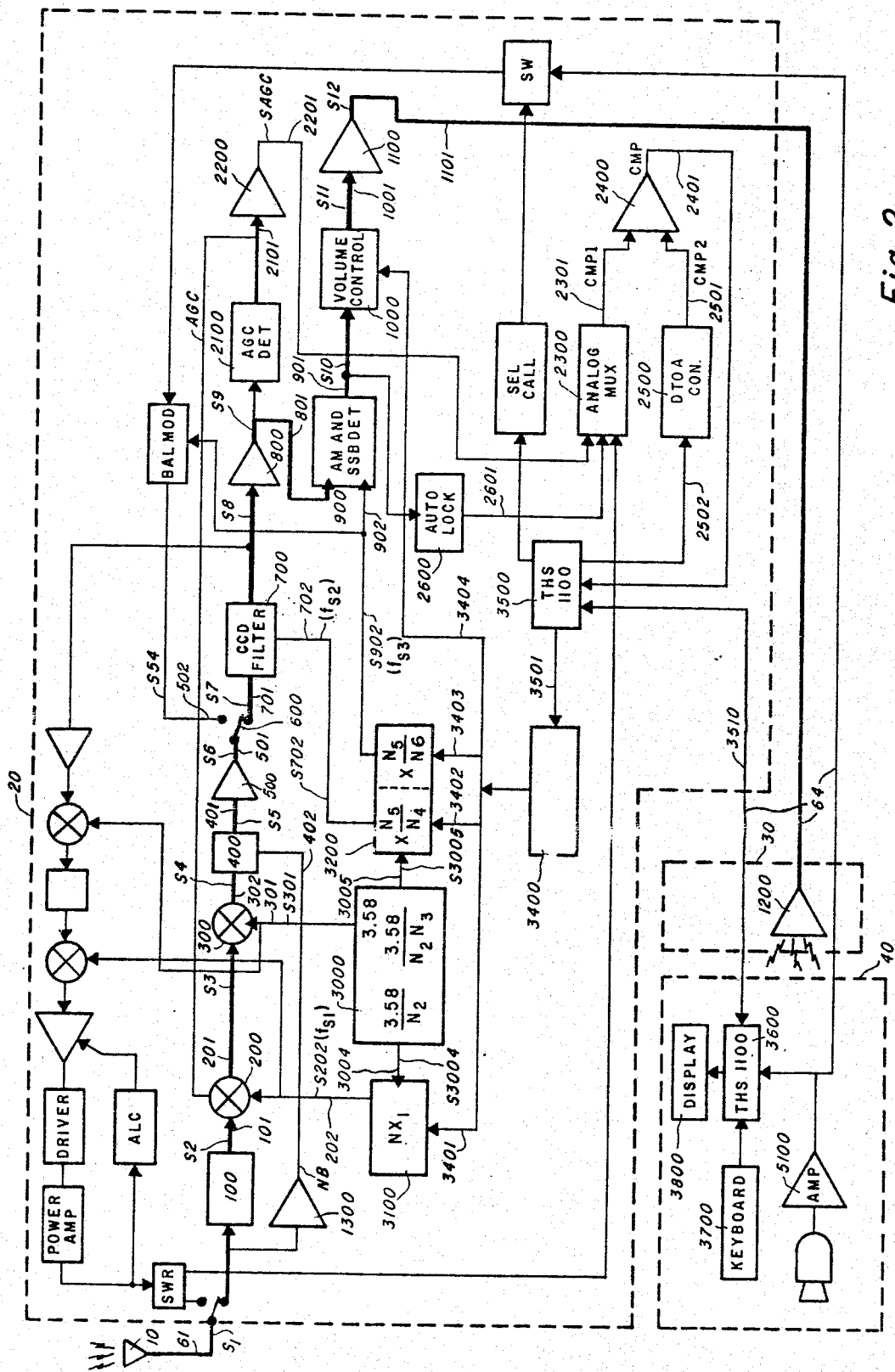
FIG. 2 is a more detailed block diagram of the transceiver of FIG. 1 wherein the receive signal path components are emphasized.

The manner in which the transceiver of FIG. 1 performs the above described receive operation is best understood by referring to FIG. 2 and FIG. 3. FIG. 2 is a circuit diagram of the transceiver of FIG. 1. The circuit includes a signal path which is operable in the receive mode and which is emphasized in FIG. 2 by a thickened line. Signals S1–S12 are present at various points (as N) on this signal path. FIG. 3 is a set of GRAPHS 3A–3K comprised of frequency diagrams of some of the signals S1–S12 in the frequency domain.

Antenna 10 is the first element of the receive signal path. Cable 61 couples to the output of antenna 10 and signal S1 as illustrated in GRAPH 3A is generated thereon. Basically, signal S1 is unfiltered and thus is comprised of frequency components which cover the electromagnetic spectrum. Lead 61 couples to filter 100. Filter 100 has an output lead 101 and signals S2 are generated thereon. As illustrated in FIG. 3b, signal S2 has a frequency range of approximately 26MHz to 28 MHz. The skir response of filter 100 is not critical as its only function is to pass the band of frequencies lying between 26.965 MHz and 27.405 MHz. This range of frequencies includes 40 amplitude modulated (AM) channels as pesently assigned by the FCC. Each AM channel is divided into a lower sideband channel and an upper sideband channel. GRAPH 3B illustrates the 26.965 MHz –27.405 MHz frequency range by the cross hatched areas S2a. GRAPH 3B1 is a blow up of area S2a and single sideband channels L1, U1, L2, U2, lying within the first two AM channels are illustrated therein.

Lead 101 couples to the signal input of a mixer 200 which has an output lead 201 and signals S3 are generated thereon. Mixer 200 also has an input lead 202 for receiving clock signals of the first selectable frequency $f_{s1}$. The frequency $f_{s1}$ is chosen to equal the difference between the center frequency of the selected AM channel and the quantity 3.125 mHz. Mixer 200 generates signals S3 by mixing signal S2 with frequency $f_{s1}$, and thus the selected AM channel is centered at the frequency 3.125 mHz. This fact is illustrated in GRAPH 3C.

Lead 201 couples to a second mixer 300. Mixer 300 has a clock input lead 301 and an output lead 302. A clocking signal of 3.58 mHz is applied to lead 301. Mixer 300 mixes signals S3 with the signal on lead 301 and, in response thereto, generates signals S4 on lead 302. As a result of the mixing operation, the selected AM channel in S4 is centered at frequency 455 kHz. GRAPH 3D illustrates signal S4.

Signal S4 passes through a noise blanker 400, and noises blanker 400 is serially coupled to an amplifier 500. Signals S5 and S6 are generated by noise blanker 400 and amplifier 500, respectively. In general, the function of noise blanker 400 and amplifier 500 is to filter and amplify signal S4, but not to frequency shift signal S4. Thus, the center frequency of the selected channel is present in signal S6 at 455 kHz. Signal S6 is illustrated in the frequency domain in GRAPH 3E.

In the receive mode, a switch 600 couples signals S6 to the input of a charge transfer device filter 700 via a lead 701. Charge transfer device filter 700 also has a clocking lead 702 for receiving clocking signals of a second selectable frequency $f_{s2}$. In response to the frequency $f_{s2}$, filter 700 generates output signals S8 on a lead 703.

In the preferred embodiment, charge transfer device filter 700 is a charge coupled device (CCD) transversal filter having a plurality of passbands which are programmable by varying the selectable frequency $f_{s2}$. GRAPH 3F illustrates the frequency response of the charge coupled device filter having the above described characteristics. The function of the filter 700 is to receive signals S7 on lead 701, to filter a selected one of the channels (either AM or sideband) from the plurality of channels comprising signal S7, and to frequency shift the selected channel down in frequency.

If the selected channel is a single sideband channel, the channel has a width of approximately 5 kHz and thus filter 700 is clocked with a frequency $f_{s2}$ such that its passbands are approximately 5 kHz wide. The frequency $f_{s2}$ is chosen such that one of the multiple passbands of filter 700 aligns with the sideband channel to be selected from S7.

GRAPH 3E1 is a blow up of signal S7 about the frequency of 455 kHz, and Graph 3F1 is a blow up of GRAPH 3F about the same frequency. Together, these figures illustrate the alignment of the eleventh passband of filters 700 with the selected channel. It should also be noted, as illustrated in GRAPH 3E1 that the mixing operation of mixer 300 results in the flip-flopping in frequency of the upper and lower sideband channels.

The clocking frequency $f_{s2}$ is also chosen such that filter 700 has bandwidths of approximately 10 kHz, one of which is centered about the frequency of 455 kHz. Such a characteristic is used to pass an AM signal centered about 455 kHz.

Lead 703 couples the output of CCD filter 700 to an amplifier 800. Amplifier 800 is tuned to pass only those frequencies lying within the first passband of CCD filter 700. GRAPH 3G illustrates signal S9 on the same frequency scale as GRAPH 3F (which illustrates the passbands of filter 700); and GRAPH 3H illustrates signal S9 on an expanded frequency scale so that its characteristics are more apparent. In GRAPH 3H, the signal S9 is illustrated as lower sideband channel L2 as an example.

Signal S9 is coupled to a demodulator 900 via the lead 801. Demodulator 900 functions to shift signals S9 in frequency to the audio range. When sideband signals are received, this shift in frequency is accomplished by time sampling signal S9 at a third selectable $f_{s3}$. Time sampling equals convolution in the frequency domain. GRAPH 3I illustrates the frequency components of a sampling transfer function H2 which samples at a frequency $f_{s3}$ and FIG. 3J illustrates the convolution of signal S9 with transfer function H2. This convolution signal is labeled S10 and is generated on a lead 901.

In order to properly shift signal S9 to the audio frequency range by the convolution operation, it is necessary that the frequency $f_{s3}$ be carefully aligned frequencies of S9. When signal S9 is a lower sideband, frequency $f_{s3}$ is chosen to align with the lowest frequency present. Thus, in GRAPH 3H, frequency $f_{s3}$ lies to the left of the quantity $f_{s2}/4$, and nominally is 20.346 kHz.

One difficulty in receiving single sideband signals is that they have no carrier to lock onto. Thus, the exact position in frequency of the signal S9 is unknown. All that is known is that the signal lies somewhere within its assigned 5kHz channel; and therefore a problem exists in being able to align frequency $f_{s3}$ with signal S9 regardless of where the latter lies within its channel. The tone quality of the resulting audible signal is directly related to how well frequency $f_{s3}$ and signal S9 are aligned. Elements 3200-3500 provide a means for incrementally adjusting frequency $f_{s3}$ so as to be properly aligned with signal S9 regardless of where it lies within its 5-kHz channel.

As described above, amplitude modulated signals may also be received. In that case, frequency $f_{s2}$ equals 202,218; and therefore signal S9 which is centered at $f_{s2}/4$ has a center frequency of 50.555 kHz. Demodulator 900 shifts this signal to the audio range by a standard diode envelope detector which does not require a third sampling frequency.

Signal S10 couples via lead 901 to volume control unit 1000. Volume control unit 1000 has an output lead 1001 and signals S11 are generated thereon. Lead 1001 couples to an audio amplifier 1100 which has an output lead 1101 and signals S12 are generated thereon. Lead 1101 is coupled to a speaker 30 where the signals S12 are converted to audible sound as illustrated in GRAPH 3K.

As the preceding description indicates, the operation of the transceiver of FIG. 2 is dependent upon the proper generation of three selectable frequencies $f_{s1}$, $f_{s2}$, and $f_{s3}$. The clocking means for generating these frequencies will now be described. FIG. 2 illustrates these clocking means in block diagram form. They are comprised of clocking modules 3000, 3100, and 3200. Basically, module 3000 generates signal S301 which is comprised of a fixed frequency of 3.58 mHz. Module 3000 also generates signals S3004 and S3005 on leads 3004 and 3005, respectively. Lead 3004 couples to module 3100, which in response to S3004 generates signals S202 comprised of frequency $f_{s1}$. Lead 3005 couples to module 3200 which receives signals S3005 and, in response thereto, generates signals S702 and S902 comprised of frequencies $f_{s2}$ and $f_{s3}$, respectively.

The selectable frequencies $f_{s1}$, $f_{s2}$, $f_{s3}$ are generated by modules 3000 and 3200 as multiples of 3.58 mHz. These multiples are designated as $N_1$-$N_6$ in FIG. 2. Some of the multiples are fixed, while other multiples are programmable. TABLE VI lists the selectable frequencies $f_{s1}$, $f_{s2}$, $f_{s3}$ along with the multiples $N_1$-$N_6$ and the intermediate clocking signals S3004 and S3005 as a function of the particular single sideband channel or AM channel that is to be received.

TABLE IV

| | SSB-CH | | | | AM-CH | |
|---|---|---|---|---|---|---|
| | IL | 1U | 2L | 2U | 1 | 2 |
| osc | 3.58MHZ | | | | | |
| $f_{s1}$ | 23.84MHZ | 23.84MHZ | 23.85MHZ | 23.85MHZ | 23.84MHZ | 23.85MHZ |
| $N_2$ | 1432 | | | | | |
| S3004 | 2.5KHZ | | | | | |
| $N_1$ | 9,536 | | 9,540 | | 9,536 | 9,540 |
| $f_{s2}$ | 86,932HZ | 86,409HZ | 86,932HZ | 86,409HZ | 202,218HZ | |
| $N_3$ | 10 | | | | | |
| S3005 | 250HZ | | | | | |
| $N_4$ | 55 | | | | 24 | |
| $N_5$ | 19,125 | 19,010 | 19,125 | 19,010 | 19,413 | 19,413 |
| $f_{s3}$ | 20,345HZ | 22,950HZ | 20,345HZ | 22,959HZ | H | H |
| $N_6$ | 235 | 207 | 235 | 207 | X | X |

Figure 4A:
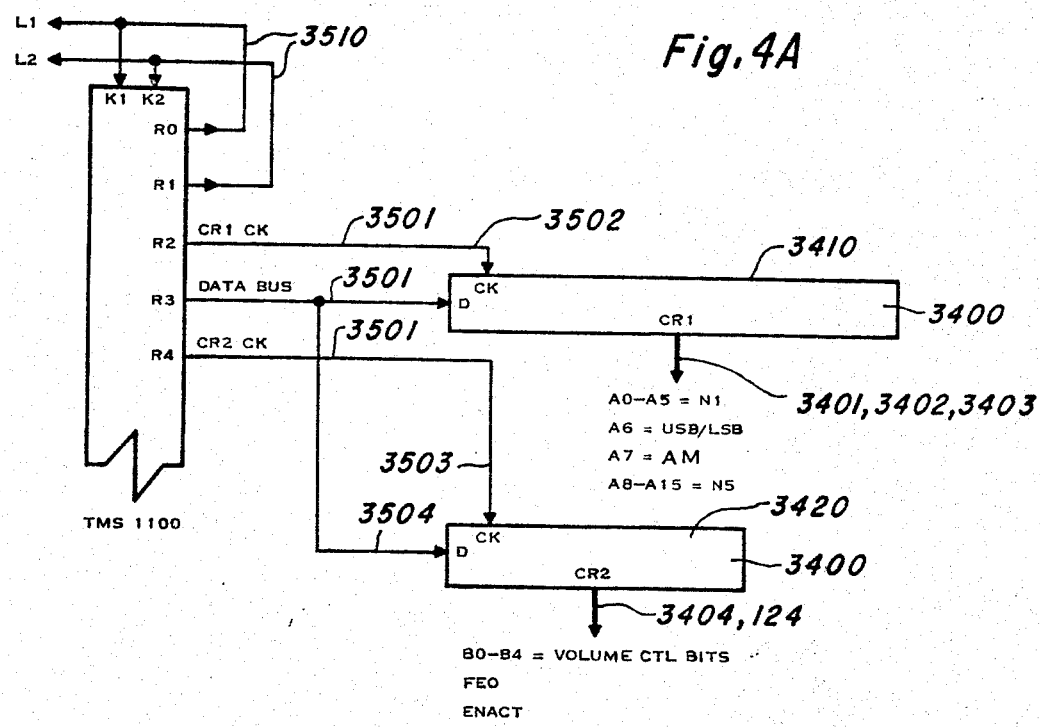
FIG. 4A is a circuit diagram illustrating the source of logic signals which are utilized by clocking modules 3000-3200.

Referring now to FIG. 4A, the source of the logic signals which are generated to specify the value of multipliers N1, N4, N5, and N6, and to operate volume control unit 1000 is therein illustrated. The source of these logic signals includes two logic registers 3400. One of the registers 3410 is a 16-bit register, and it has outputs coupled to leads 3401, 3402, and 3403. Outputs 0–6 of register 3410 are coupled to lead 3401 and signals A0–A6 are generated thereon. Output bits 7–15 of register 3410 are coupled to leads 3402 and signals A7–A15 are generated thereon. Output 3410 is coupled to lead 3403 to generate signal A6.

The second register 3420 is a seven-bit register. It has output bits 0–4 coupled to leads 3404 to thereby provide the volume control logic signals B0–B4. Bit 5 of register 3240 is coupled to lead 124 to provide previously described logic signal FEO. Bit 6 of register 3240 provides a logic signal ENACT (enable auto call transmit) the function of which is described later in conjunction with transmit.

Registers 3410 and 3420 are comprised of D-type flip flops. A microprocessor 3500 is utilized to provide data and clocking input signals for both of these registers over leads 3501. This data constitutes microcommands which are interpreted and responded to by circuits coupled to the register outputs. In one embodiment, microprocessor 3500 is comprised of a TMS1100 which is manufactured by Texas Instruments Incorporated. Details of the TMS1100 are given in the publication entitled, "Programmers Reference Manual for the TMS 1000 Series MOS/LSI One-Chip Microcomputers." The publication is published and made available through Texas Instruments Incorporated. See also U.S. Pat. No. 3,991,305, by inventors Caudel et al. assigned to Texas Instruments Incorporated.

The TMS1100 includes an 11-bit output register having bits labeled R0–R10. As illustrated in FIG. 4A, bit R2 is coupled to the clocking input of register 3410 via a lead 3502, and a clocking signal CR1CK is generated thereon. Similarly, bit R4 is coupled to the clocking input of register 3420 via a lead 3503, and a clocking signal CR2CK is generated thereon. Bit R3 is coupled to the data inputs of registers 3410 and 3420 via lead 3504, and a data signal called DATABUS is generated thereon.

The TMS1100 also includes a 4 bit input register having inputs K1, K2, K4, and K8. Inputs K1 and K2 are coupled to control unit 40 via leads 3510 to provide a means by which microprocessor 3500 receives control signals L1 and L2 from the control unit. In response to signals L1 and L2, microprocessor 3500 generates the logic signals CR1CK, CR2CK, and DATABUS to thereby specify the appropriate multipliers N1–N6 and the appropriate volume control bits. Signals L1 and L2 are described infra.

Several modifications to the above-described receive circuitry of the transceiver of FIG. 2 may be made without departing from the inventive concepts disclosed therein. For example, a microprocessor other than the TMS1100 may be utilized to receive control signals via leads 3510 and in response thereto to generate data and clocking signals for registers 3400. A TMS1000 or a TMS1200 may be utilized to replace the TMS1100 as an example.

Figure 4B:
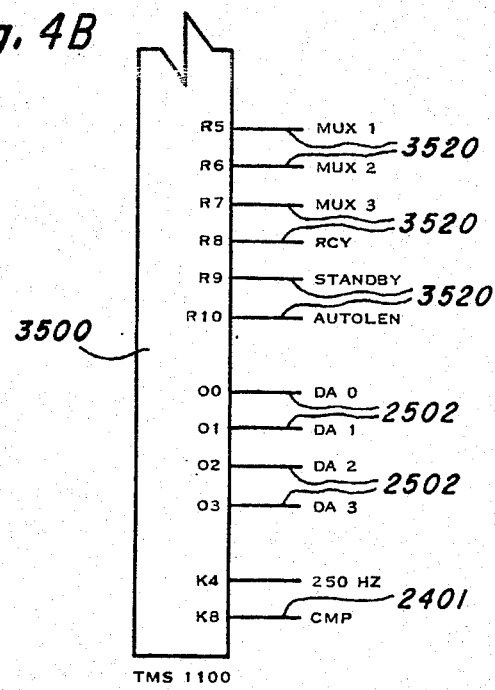
FIG. 4B is a block diagram of a micro computer which forms a portion of the circuit of FIG. 4A.
Figure 9:
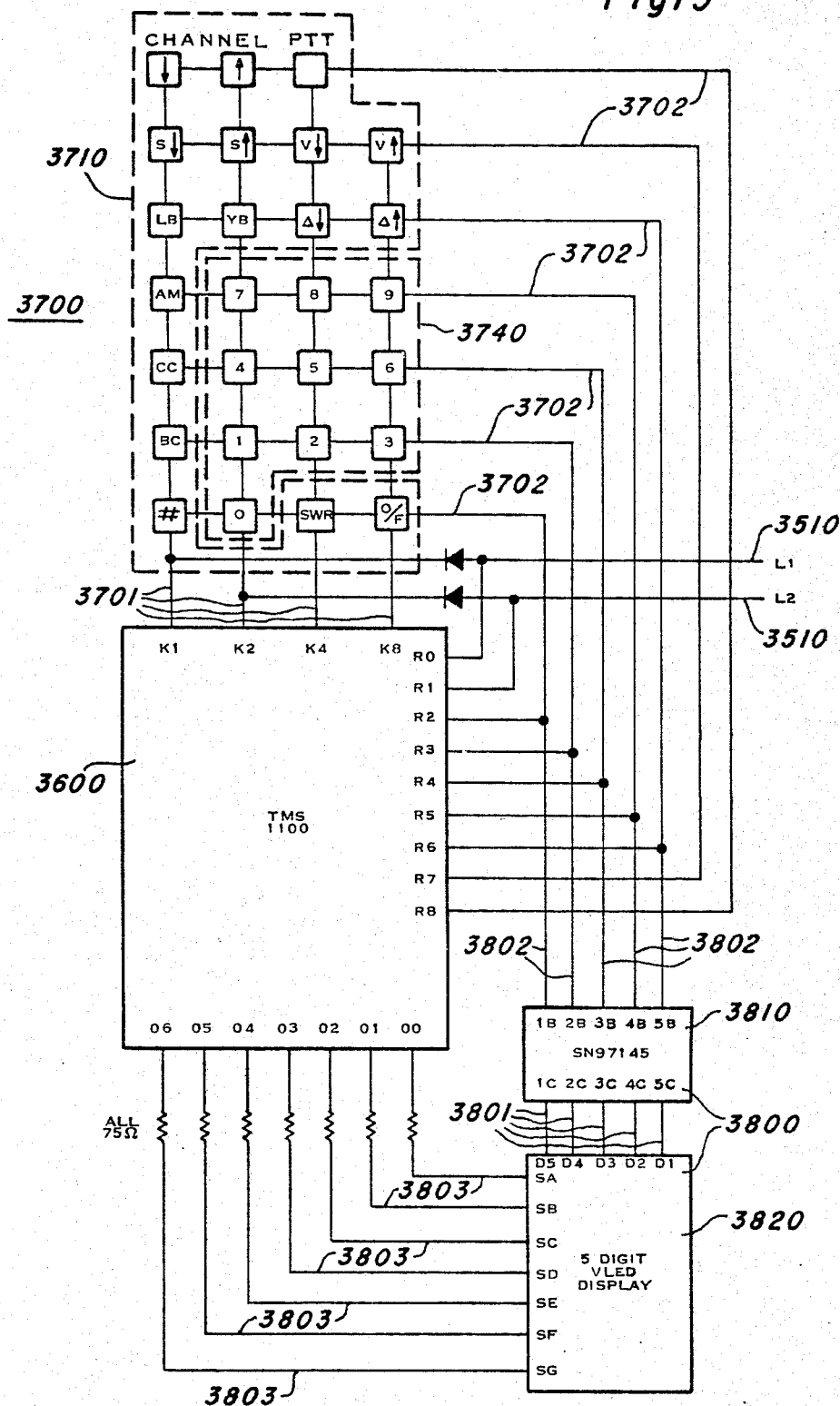
FIG. 9 is a detailed schematic diagram of the control unit included within FIGS. 1, 2 and 6.

Referring now to FIG. 4B a block diagram of that portion of the TMS1100 which was not included in FIG. 9 is therein illustrated. Input register bit K4 is coupled to receive a logic signal 250Hz, and input register bit K8 is coupled to receive a logic signal CMP. Further, output bits R5–R10 are the source of logic signals MUX1, MUX2, MUX3, RCV, STANDBY and AUTOLEN, respectively. These signals are microcommands to the circuits which receive them. Signal RCV is utilized to control switch 600 as was illustrated in FIG. 4f. In addition, the TMS100 has a second output register having output bits 00, 01, 02 and 03 which generate logic signals (microcommands), DA0, DA1, DA2, and DA3, respectively. The function of each of the above microcommands is described below.

The transceiver of FIG. 2 also includes means for performing an autolock function while receiving single sideband signals in the receive mode. The autolock function is implemented by means of autolock unit 2600. Unit 2600 has an input coupled to lead 901 for receiving signal S10 thereon, and has an output coupled via leads 2601 to an input of analog multiplexer 2300. Microprocessor 3500 receives the signals which are generated by the autolock unit on leads 2601 via multiplexer 2300 and comparator 2400. In response thereto, microprocessor 3500 calculates a value for the second selectable frequency $f_{s2}$ which will align signal S9 in the frequency domain with a fixed reference frequency. Microprocessor 3500 then generates micro-command signals on leads 3501 indicating values for N4–N6 which will generate the calculated frequency.

Figure 5A:
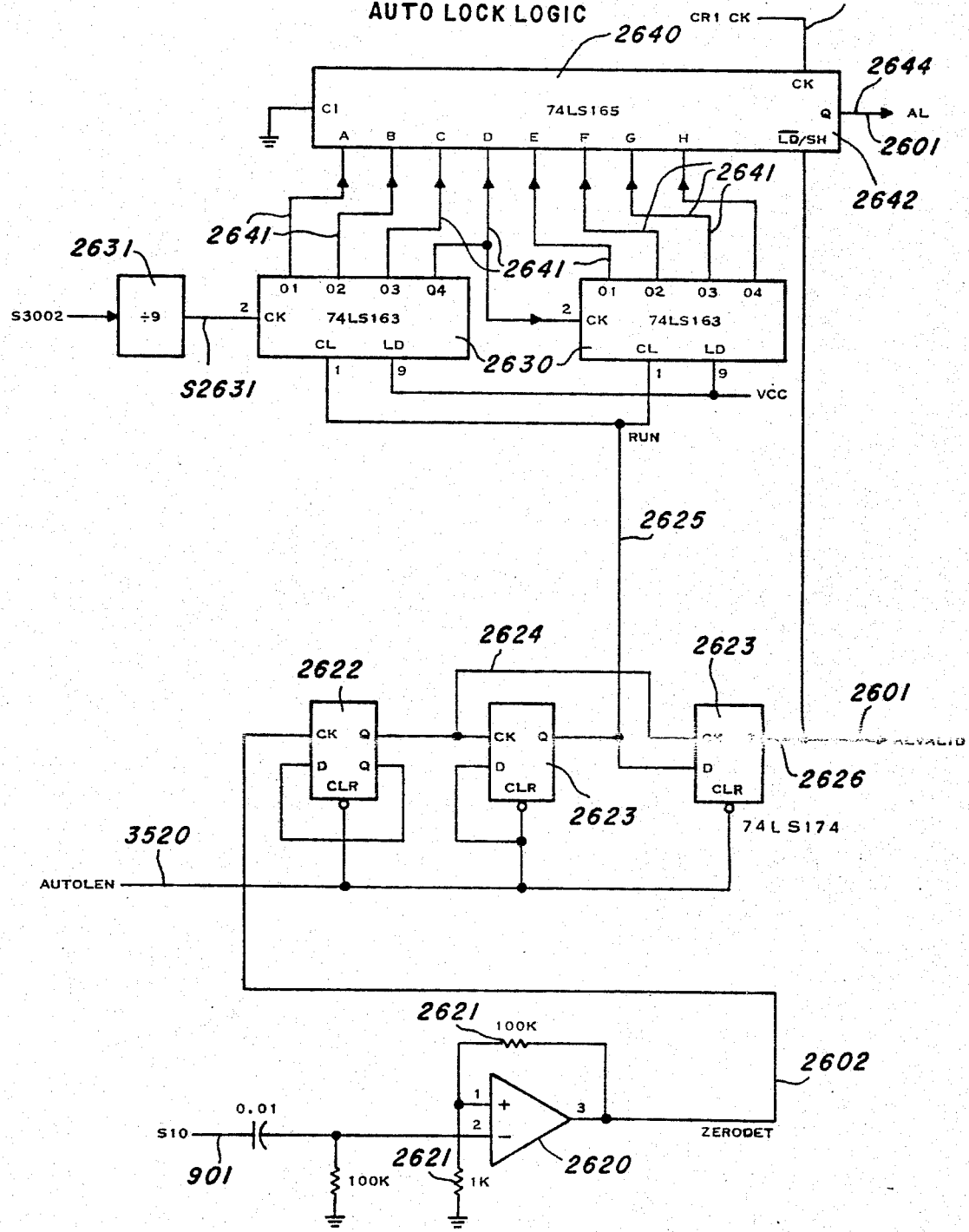
FIG. 5A is a detailed circuit diagram of the auto lock portion of the transceiver of FIG. 2
Figure 5B:
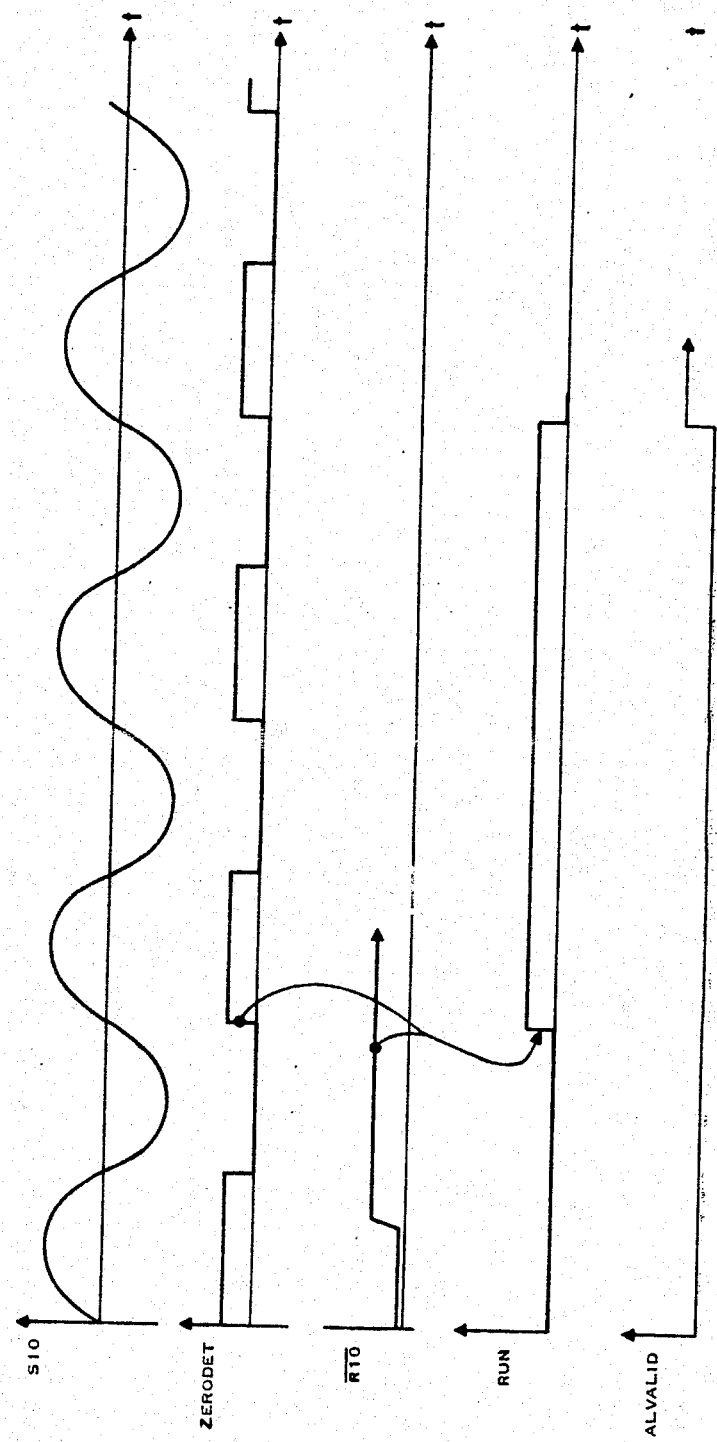
FIG. 5B is a graphic illustration of the operation thereof.

The detailed operation of the autolock function is best understood by referring to FIGS. 5A and 5B. FIG. 5A is a logic diagram of the autolock unit 2600, and FIG. 5B is a timing diagram of its opertion. The single sideband signals on which autolock unit 2600 operates include an intermittently present carrier frequency. In one embodiment, this carrier is present for a short period of time just prior to the transmission of speech signals. Autolock unit 2600 operates to measure the actual frequency of the intermittently present carrier. Microprocessor 3500 receives signals on leads 2601 indicating the carrier frequency, and in response thereto, calculates an appropriate $f_{s2}$ frequency by comparing the actual frequency of the intermittently present carrier with an expected or nominal carrier frequency.

As illustrated in FIG. 5A, autolock unit 2600 includes an operational amplifier 2620 having an input coupled to lead 901 for receiving signal S10 thereon. A resistive feedback network 2621 is coupled to amplifier 2620 in a manner which makes amplifier 2620 operation as a zero detector. Amplifier 2620 has an output coupled to a lead 2602, and signal ZERODET is generated thereon. FIG. 11b includes the timing diagram on signals S10 and ZERODET. Lead 2602 couples to the clock input of a D-flip flop 2622. Flip flip 2622 has a Q output which couples via a lead 2624 to the clocking inputs of two other D-flip flops 2623. The signal AUTOLEN, which is generated by microprocessor 3500, enables flip flops 2622 and 2623 when it is true.

Flip flops 2623 are intercoupled to generate signals RUN and ALVALID on leads 2625 and 2626, respectively only when signal AUTOLEN is true. Signal RUN is coupled via a lead 2625 to two, four-bit counters 2630. Counters 2630 are enabled to count whenever signal RUN is true, and are cleared when signal RUN is false. Counters 2630 may be implemented by a 74LS163 as an example. A clock input of counter 2630 is coupled to receive a signal S2631 having a fixed frequency of approximately 100KHz. Signal S2631 is generated by a divide by 9 counter 2631, having a clocking input coupled to recieve signal S3002.

Autolock unit 2600 also includes an 8 bit shift register 2640 having parallel inputs coupled via leads 2641 to outputs of counter 2630. A control input 2642 of register 2640 is coupled to receive logic signal ALVALID via lead 2626. Data is transferred from counters 2630 via leads 2641 into register 2640 when signal ALVALID makes a low voltage to high voltage transition. This transition occurs after counters 2630 have been enabled for two cycles of signal ZERODET.

Signal ALVALID also couples to analog multiplexer 2300 where it is sensed by microprocessor 3500. Further, register 2640 has a clocking input which is coupled to receive logic signal CR1CK via lead 2643, and has a data output which is coupled to multiplexer 2300 via lead 2644. Thus, microprocessor 3500 is capable of reading register 2640 under program control.

In one embodiment, the intermittently transmitted carrier has a frequency of 1600 Hz. By comparison, counters 2630 are clocked at a frequency of approximately 100 kHz. Since the difference in the two frequencies is large, the contents of register 2640 will reflect the actual frequency present in signal S9 to a high degree of accuracy.

Figure 6:
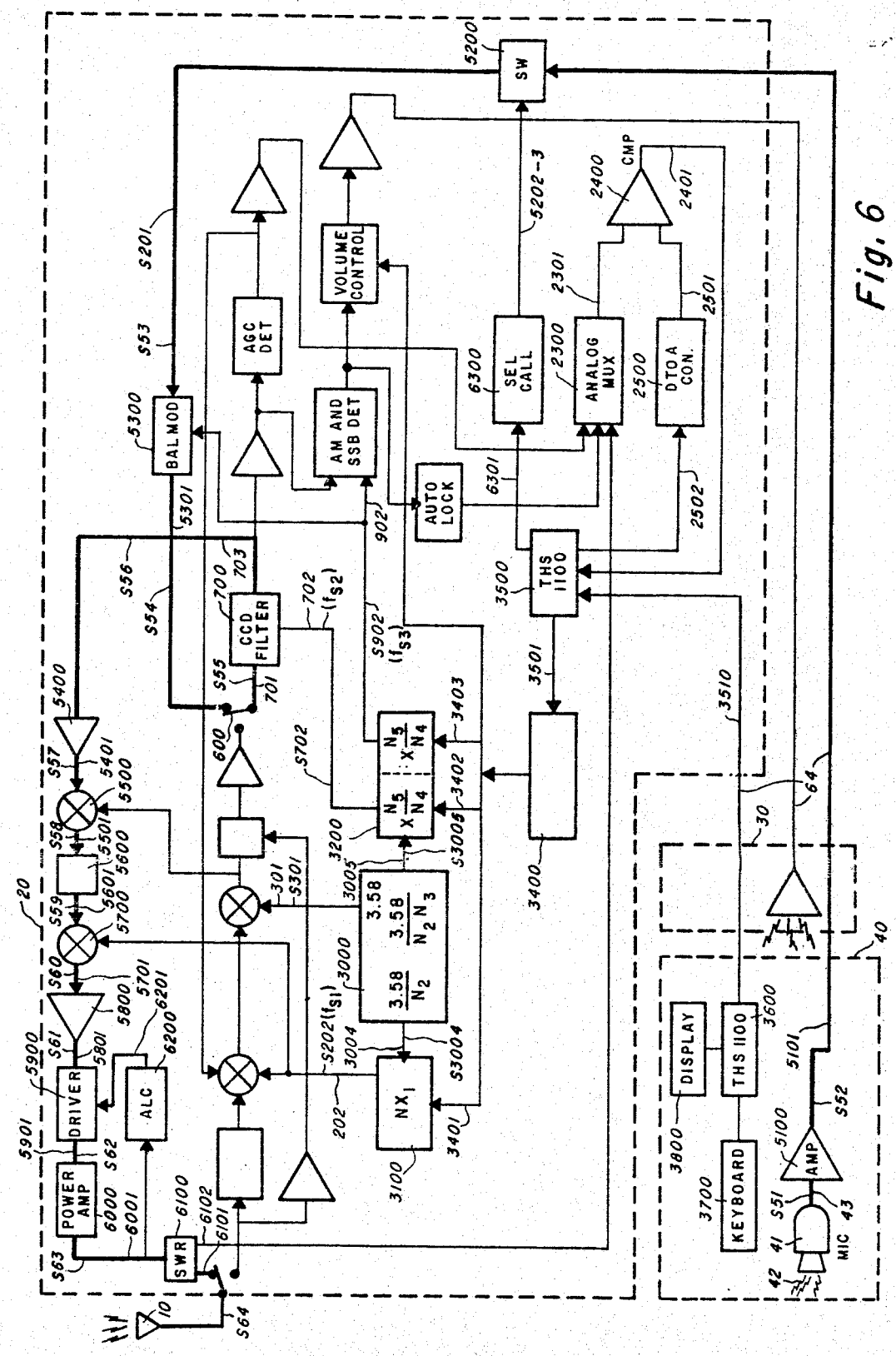
FIG. 6 is a circuit diagram identical to FIG. 2 with the exeption that the transmit signal path components are emphasized rather than the receive signal path components.

The operation of the transceiver of FIG. 1, while it is in the transmit mode, will now be described in conjunction with FIGS. 6 and 7. FIG. 6 is identical to the previously described FIG. 2, except that FIG. 6 contains reference numerals identifying those components of the transceiver which are utilized in a transmit mode, whereas FIG. 2 contains reference numerals identifying those components used in the receive mode. Also, in FIG. 6, the transmit signal path is emphasized by a thickened line, whereas in FIG. 2, the receive signal path is emphasized by a thickened line. Signals S51–S64 are generated at various points on the transmit signal path as shown in FIG. 7.

Microphone 41 is the first component included within the transmit signal path. Microphone 41 receives sound waves 42, and in response thereto, generates electronic signals S51 shown in FIG. 7A on a lead 43. Lead 43 couples to the input of an audio amplifier 5100. Amplifier 5100 has an output coupled via a lead 5101 to a switch 5200, and signals S52 are generated thereon by amplifier 5100.

When speech is being transmitted, switch 5200 passes signals S52 to its output. Signals S53 at the output of switch 5200 are coupled via lead 5201 to the signal input of a balanced modulator 5300. Modulator 5300 also has a clocking input which is coupled to lead 902 for receiving signals S902 (which contain the third selectable frequency $f_{s3}$). Modulator 5300 has an output coupled via a lead 5301 to switch 600, and signals S54 are generated thereon. Signals S54 are double sideband signals in the sideband mode of operation, and are amplitude modulated signals in the AM mode of operation. That is, the carrier frequency, which equals multiples of the third selectable frequency $f_{s3}$, is inserted into signal S54 only in the AM mode of operation by modulator 5300.

Figure 7A:
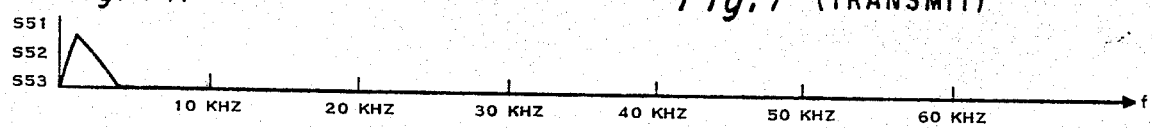
FIG. 7 is comprised of GRAPHS 7A-7K which contain a series of frequency diagrams of signals at various points on the transmit signal path of FIG. 6.
Figure 7B:
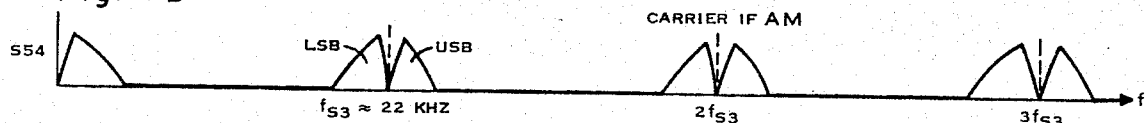
Figure 7C:
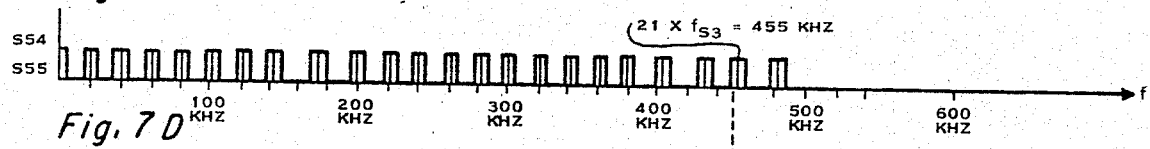

Modulator 5300 generates signals S54 by sampling signals S53 at a frequency $f_{s3}$ of approximately 22 kHz. FIGS. 7B and 7C illustrate the effect of this sampling operation on two different frequency scales. As therein illustrated, signal S54 is comprised of a plurality of identical frequency spectrums, each of which is centered about a multiple of frequency $f_{s3}$. The center of the 21st frequency spectrum lies at 455 kHz. Thus, the lower sideband portion of the 21st spectrum is centered at approximately 450 kHz, and the upper sideband portion of the 21st spectrum is centered at approximately 460 kHz.

Figure 7D:
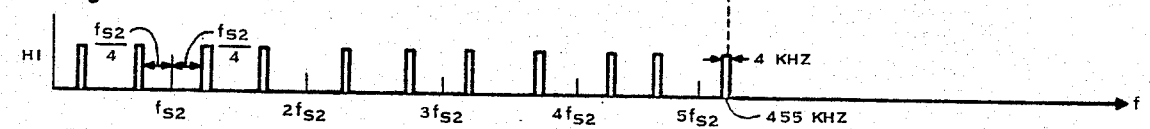

In the transmit mode, filter 700 is coupled to receive signal S54 through switch 600. The function of filter 700 is to selectively filter either the lower sideband, the upper sideband, or the AM signal which lies nearest to 455 kHz. Thus, dependent upon the mode of operation, the clocking frequency $f_{s2}$ of filter 700 is selectively chosen as designated in TABLE V such that the desired filtering is performed. FIG. 7D illustrates the passbands of filter 700 when it is clocked to pass only the lower sideband. As was the case for the previously-described read mode of operation, the 11th passband of filter 700 is used to filter sidebands from an input signal; whereas, the fifth passband of filter 700 is used to filter an AM vband from an input signal.

Figure 7E:
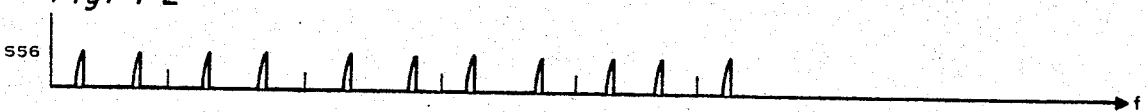
Figure 7F:
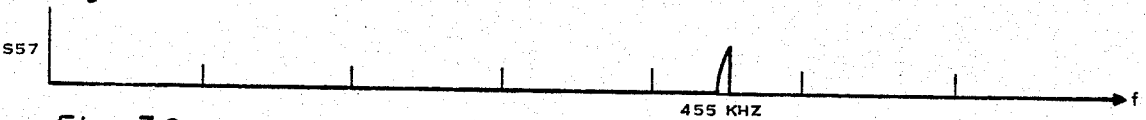
Figure 7G:
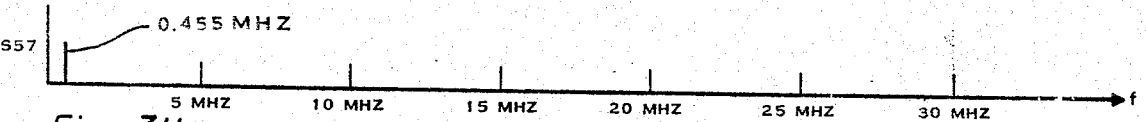
Figure 7H:

The output of filter 700 generates signals S56. Signals 56 are coupled via a lead 703 to a tuned amplifier 5400. Amplifier 5400 is tuned to 455 kHz. Amplifier 5400 has an output lead 5401 and signals S57 are generated thereon. FIGS. 7E and 7F illustrate signals S56 and S57 in the frequency domain. As therein illustrated, signal S56 includes a plurality of filtered frequency bands; whereas, signal S57 includes only that band which is nearest to 455 kHz.

TABLE V

| $f_{s2}$ | MODE |
|---|---|
| 86,409 Hz | USB |
| 86,932 Hz | LSB |
| 202,218 Hz | AM |

Lead 5401 couples to the input of a mixer 5500. Mixer 5500 has a clocking input which is coupled to a lead 301 for receiving signals S301 thereon. Signal S301 includes a fixed 3.58-mHz frequency, and it is generated as described supra. Mixer 5500 has an output coupled to a lead 5501, and signals S58 are generated thereon. Signals S58 equal signals S57 frequency shifted to 3.58 mHz ±455 kHz.

Figure 7I:
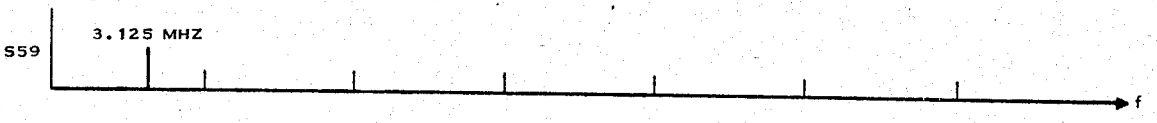
Figure 7J:
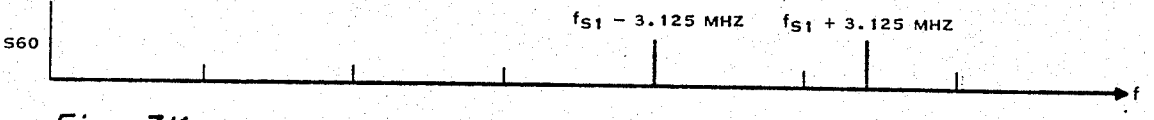

Lead 5501 couples to the input of the filter 5600. Filter 5600 is tuned to only pass frequencies near 3.125 mHz. The output of filter 5600 is coupled to a lead 5601, and signals S59 are generated thereon. FIG. 7I illustrates signals S59 in the frequency domain.

Lead 5601 couples to the input of a mixer 5700. Mixer 5700 has a clocking input which couples to lead 202 for receiving signals S202. Signals S202 are generated as previously described, and contain the first selectable frequency $f_{s1}$. Frequency $f_{sl}$ is selectively chosen such that the sum of $f_{s1}$ +3.125 mHz equals the center frequency of the channel on which signals S51 are to be broadcast. Mixer 5700 has an output coupled to a lead 5701, and signals S60 are generated thereon. Signals S60 equal signals S59 frequency shifted to $f_{sl}$ ±3.125 mHz as indicated in FIG. 14J.

Figure 7K:
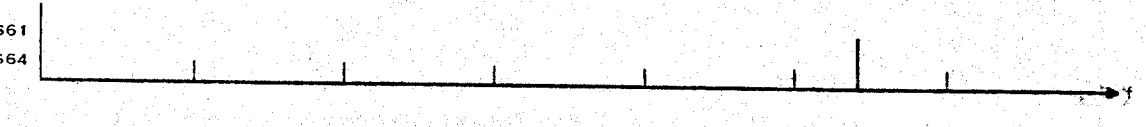

An amplifier 5800 is coupled to receive signal S60, and to tune out the lower band of frequencies. FIG. 7K illustrates the frequency spectrum of signal S61.

Signal S61 is serially coupled to the antenna 10 through a driver circuit 5900, a power amplifier 6000, and a standing wave ratio measuring circuit 6100. Signals S62, S63, and S64 are generated by these circuits, respectively. Driver 5900 and power amplifier 6000 modify the amplitude of signal S61, but not the frequencies contained therein. Thus, signal S64, which is transmitted by antenna 10, has the same frequency spectrum as signals S61, as illustrated in FIG. 7K.

Figure 8A:
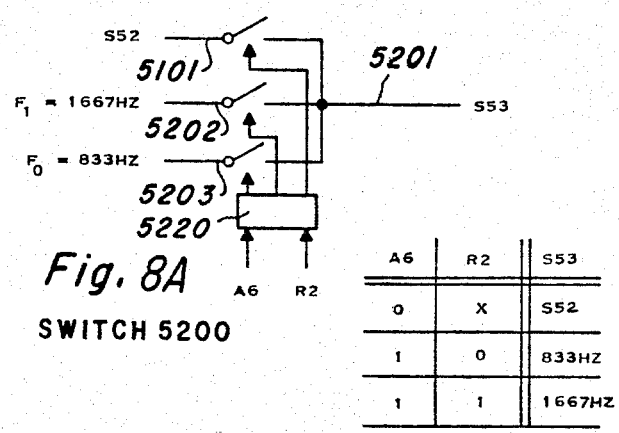
FIG. 8A is a detailed circuit diagram of switch 5200.

FIG. 8A is a functional schematic of switch 5200. Switch 5200 has three signal inputs coupled to leads 5101, 5202 and 5203 for receiving signals S52, $f_0$, and $f_1$, respectively. A logic enabling network 5220 is provided for receiving signals A6 and R2. Signals A6 and R2 logically pass one of the three input signals through switch 5200. FIG. 8A includes a truth table indicating this logical operation.

Signals VSWRF and VSWRR are coupled via leads 6003 and 6004 to analog multiplexer 2300. Microprocessor 3500 selectively measures the voltage of signals VSWRF and VSWRR by means of digital-to-analog converter 2500 and comparator 2400. In the transmit mode, microprocessor 3500 intermittently transmits a 1667-Hz signal for short time intervals via a selective call unit 6300 (described infra) and measures the ratio of signals VSWRF and VSWRR.

The transceiver of FIG. 6 further includes a means for performing a selective call operation. To perform a selective call operation, a receiving transceiver is assigned a call number. The call number consists of a sequence of five digits. Subsequently, a transmitting transceiver transmits the call number; and in response thereto, the receiving transceiver senses the transmitted call number as being the one which it was assigned. In response to the sensing of its call number, the receiving transceiver performs a preprogrammed operation (e.g., the microprocessor in the receiving transceiver turns the volume on).

Figure 8B:
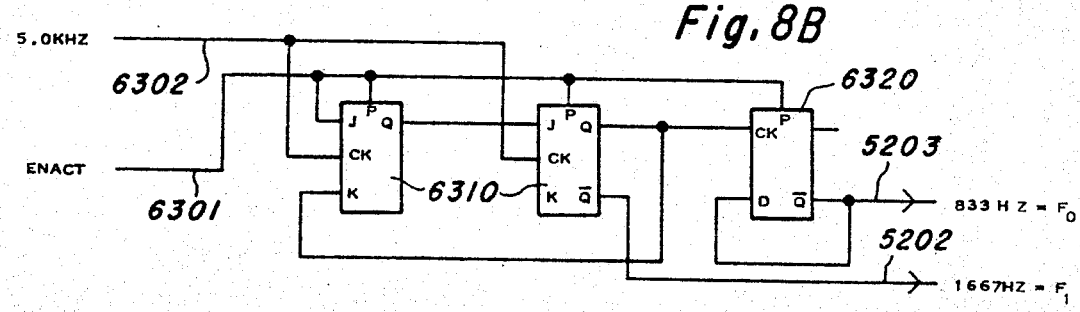
FIG. 8B is a logic diagram of the selective call unit included within the transceiver of FIG. 6.

FIG. 8B is a logic diagram of a selective call unit 6300 which is included in the transceiver of FIG. 6. Call unit 6300 is comprised of two J-K flip-flops 6310 and a D flip-flop 6320. The J-K flip-flops are intercoupled to form a divide-by-three counter, while the D flip-flop is intercoupled to form a divide-by-two counter. A logic signal ENACT generated by a microprocessor 3500 is coupled via a lead 6301 to enable counters 6310 and 6320; and a clocking signal having a fixed frequency of 5.0 kHz is coupled via a lead 6302 to clocking inputs of flip-flops 6310. In response thereto, a signal f1 of 1667 Hz and a signal f0 of 833 Hz are generated on leads 5202 and 5203 respectively. Leads 5202 and 5203 couple to the input of switch 5200 as was previously described in conjunction with FIG. 8A. The output of switch 5200 is logically controlled by a microprocessor 3500 via logic signals A6 and R2.

The above-described configuration provides a means for transmitting a binary coded selective call number. Each digit of the selective call number is represented by a sequence of four binary bits. A "0" bit is represented by 833 Hz, while a "1" is represented by 1667 Hz. The "1" and "0" frequency assignments may also be reversed as an alternative. Each bit comprising the call number is transmitted for one bit period. The bit period equals 32 ms in one embodiment. The actual transmission of a call number is manually activated via control unit 40, as is described infra.

The receiving transceiver utilizes the previously-described autolock logic 2600 for recognizing when its assigned unit number is transmitted. The receiving transceiver first monitors the SAGC signal to determine the presence of signal. Then it enables its autologic. Once enabled, the AL signal reflects a count of either 833 Hz or 1667 Hz for each bit that is transmitted. Microprocessor 3500, in the receiving transceiver, reads signal AL and compares the bit sequence to its assigned unit number. When the received call number annd the assigned call number are equal, the receiving transceiver is activated.

Selective call unit 6300 is also utilized in the sideband transmit mode to transmit an intermittent carrier for the receiving transceiver to lock onto. (The operation of the receiving transceiver was described in conjunction with FIGS. 12A and 12B.) In one embodiment, microprocessor 3500, in the transmitting transceiver, logically controls switch 5200 such that selective call unit 6300 transmits the 1667-Hz frequency for 300 ms at the beginning of each transmission. The receiving transceiver detects the presence of the transmitted frequency by monitoring SAGC, and by enabling autolock unit 2600 when SAGC exceeds the squelch level.

The apparatus described above for performing a digital selective call is also capable of assigning different call numbers to several channels. That is, keyboard 3700 in control head 40 is utilized to send a plurality of call numbers and associated channels to processor 3500. Processor 3500 stores the call numbers in its memory; and selectively reads the call numbers for comparison with a transmitted call number dependent upon which channel it was being operated on at a particular time period.

Additionally, the apparatus described above may be utilized to transmit digital selective call numbers plus subsequent digital control messages. The digital messages are specified by the operator utilizing keyboard 3700 in a manner similar to that used to select a particular call number. The digital control message is received by processor 3500 via leads 3510. In response thereto, processor 3500 sends microcommands to switch 5200 to thereby couple the 1 and 0 frequencies to the antenna in a manner which indicates the bits of the digital control message. The receiving transceiver utilizes the autolock logic 2600 for receiving the digital control message in the same manner that it is utilized to receive a selective call number. Processor 3500 of the receiving unit interprets the digital control message and generates microcommands in response thereto for implementing the digitally-coded function. For example, such digital control messages could be utilized to remotely control stereos, televisions, or home lighting.

The means for manually operating the transceiver of FIG. 6 (and the transceiver of FIG. 2) will now be described in conjunction with FIG. 9. FIG. 9 is a detailed schematic diagram of keyboard 3700, display 3800, and microprocessor 3600, all of which are included within control head 40. In general, each operation which the transceiver performs is initiated via keyboard 3700.

Keyboard 3700 includes a plurality of control keys 3710 and a plurality of digit keys 3740. Control keys 3710 include a C ↑ key and a C ↓ key for incrementing the channel up or down respectively. Also, an S ↑ key and an S ↓ key is provided for modifying the squelch setting upward or downward respectively. Similarly, a V ↑ and a V ↓ key is provided for turning the volume up or down, respectively. And a Δ ↑ key annd a Δ ↓ key are provided for moving the clarifying frequency (i.e., $f_{s2}$) up or down respectively while receiving sideband signals.

Keyboard 3700 further includes keys LB, UB, and AM for selecting lower sideband, upper sideband or AM mode of operation, respectively. Also a CC key is provided for enabling the clear channel function, while a BC key is provided for enabling the busy channel function. A # key is provided for assigning a call number to the transceiver, and for enabling the transceiver to transmit a call number. A SWR key is provided for reading out the standing wave ratio. An O/F key is provided for enabling or disenabling the transceiver. And a PTT key (push to talk) is provided for enabling the transmit mode of operation.

Additionally, digit keys 3740 are provided for use in conjunction with various of the above-described control keys. For example, digit keys 2740 are used in conjunction with the LB key, UB key, and AM key for selecting a channel and mode of operation simultaneously. The actual sequence in which keys 3740 and keys 3710 are used to activate the various functions is listed in TABLE VI which will be described shortly.

Keyboard 3700 couples via leads 3701 and 3702 to microprocessor 3600 and is sensed thereby. Leads 3701 couple to the K register inputs of processor 2600, whereas leads 3702 couple to the R register outputs of microprocessor 3600. Thus, the state of any key within keyboard 3700 is sensed by microprocessor 3600 by selectively setting bits in register R, and by sensing for a return signal in register K.

Display 3800 also couples to microprocessor 3600 and is controlled thereby. Display 3800 is comprised of a 5-digit LED display 3820 and a digit driver circuit 3810. Leads 3801 couple the output of driver circuit 3810 to the digit inputs of display 3820; which leads 3802 couple the input to driver circuit 3810 to the output of register R of microprocessor 3600. The output of register O of microprocessor 3600 is coupled via leads 3803 to the segment inputs of LED display 3820. Thus, the state of the 5-digit display 3820 is controlled by microprocessor 3600 via its registers R and O.

Microprocessor 3600 is further coupled via lead 3510 to microprocessor 3500. Leads 3510 provide the means whereby messages are sent between microprocessors 3500 and 3600.

All messages which are transmitted by the master or by the slave processor on leads 3510. Each message consists of an ID digit, followed by message digits M1–M5, followed by a check digit C. Each of the digits is comprised of four bits. The ID digit indicates the general nature of the message. The message digits indicate the specific details of the message. And the check digit is generated as a function of the ID digit and the M1–M5 digits. For example, in one embodiment, it equals the sum of the "1" bits in the ID digit and M1–M5 digits.

Table VI lists several functions which the transceivers of FIGS. 2 and 14 perform, and indicates which keys of keyboard 3700 and which messages between the master and slave are utilized to implement each function.

TABLE VI Continued

ASSIGN A SEL. CALL NUMBER TO TRANSCEIVER
KEY SEQ. = N1, N2, N3, N4, N5, # where N1–N5 is the selective call number; then depress key "0".

L1, L2 MESSAGE SEQUENCE:

| | | | | | |
|---|---|---|---|---|---|
| 1-MASTER = 0 | N1 | N2 | N3 | N4 | N5 | C
| 2-SLAVE = C | channel number | channel number | Mode | signal strength | status | C
| 3-MASTER = E | 2 | Φ | Φ | Φ | Φ | C
| 4-SLAVE = C | channel number | channel number | Mode | signal strength | status | C TRANSMIT A SEL. CALL NUMBER
KEY SEQ. = N1, N2, N3, N4, N5, # where N1–N5 is the call number to be transmitted; then depress Key "1".

L1, L2 MESSAGE SEQUENCE:

| | | | | | |
|---|---|---|---|---|---|
| 1-MASTER = 1 | N1 | N2 | N3 | N4 | N5 | C
| 2-SLAVE = C | | | | | | C
| 3-MASTER = E | 4 | Φ | Φ | Φ | Φ | C
| 4-SLAVE = C | | | | | | C

The digits N1–N5 are transmitted subsequently, when the push to talk key "PTT" is depressed.

PUSH TO TALK
KEY SEQ. = DEPRESS PTT
L1, L2 MESSAGE SEQUENCE (W/o SEL. CALL)

| | | | | | |
|---|---|---|---|---|---|
| 1-MASTER = E | 8 | Φ | Φ | Φ | Φ | C
| 2-SLAVE = C | channel number | channel number | Mode | signal strength | status | C L1, L2 MESSAGE SEQUENCE (W. SEL. CALL)
1-MASTER = E | A | Φ | Φ | Φ | Φ | C
2-SLAVE = SAME AS ABOVE

TABLE VI Continued-continued

| L1, L2 MESSAGE SEQUENCE (W. SEL. CALL & DIGITAL CALL MESSAGE) | | | | | |
|---|---|---|---|---|---|
| 1-MASTER = E ⌐ A<br>2-SLAVE = SAME AS ABOVE | Φ | Φ | Φ | Φ | C |
| KEY SEQ. = RELEASE PTT<br>L1, L2 MESSAGE SEQUENCE | | | | | |
| 1-MASTER = E ⌐ 4<br>2-SLAVE = SAME AS ABOVE | Φ | Φ | Φ | Φ | C |

All of the previously described details may be interrelated by considering typical transceiver operations in conjunction with the transceiver block diagrams of FIGS. 2 and 13. Referring to FIG. 2, for example, suppose an operator wishes to operate on channel 1 in the lower sideband mode. Utilizing keyboard 3,700, the operator sequentially depresses digit keys 0 and 1, and control key LB. In response thereto, processor 3,600 senses the depressed keys, and sends messages via leads 3,510 to the slave processor 3,500.

Slave processor 3,500 interprets the messages and in response thereto sends microcommands to registers 3,400 via leads 3,501. The microcommands indicate clocking frequencies $f_{s1}$, $f_{s2}$, $f_{s3}$, such that the lower sideband of channel 1 will pass through the received signal path. The microcommands will indicate an $N_1$ of 9,536; an $N_4$ of 55; an $N_5$ of 19,125; and an $N_6$ of 235. The values of N2 and N3 are fixed at 1,432 and 10, respectively. As a result of these microcommands, clocking module 3,100 generates clocking signal S202 of a frequency 23.84MHz. Similarly, clocking module 3,200 generates clocking signal S702 with frequency 86,932 and also generates clocking signal S902 with a frequency of 20,345Hz.

Mixer 200 mixes signals S2 and frequency $F_{S1}$ to thereby generate signals S3 on lead 201. Frequency $F_{S1}$ was chosen such that channel 1 of signal S3 is centered at frequency 3.125MHz because mixer 200 includes a tank circuit having a resonant frequency of 3.125 MHz. As such, signal S3 discriminates between the selected channel and the surrounding channels.

Mixer 300 mixes signal S3 with the fixed frequency of 3.58MHz. The difference between 3.58MHZ and 3.125MHZ equals 455KHz; and mixer 300 includes a tank circuit having a center frequency of 455KHz. Thus, the output of mixer 300, which is signal S4, contains channel 1 at 455KHz.

Signal S4 is coupled to CCD filter 700 through a switch 600. Switch 600 is controlled by microcommands from processor 3,500. The microcommands are generated in response to the manually activated PTT key on keyboard 3,700.

Filter 700 receives signals S5 and filters the lower sideband from the signal in response to frequency $f_{S2}$ of clocking signals S702. Signal S8, which is the output of the filter, is the lower sideband of channel 1 as the operator selected.

Signal S8 passes through the modulator 900. The modulator 900 simultaneously receives clocking signals on leads 902 which contain the third selectable frequency $f_{S3}$. Demodulator 900 samples the selected sideband signals at frequency $f_{S3}$; and as a result, the selected sideband is frequency shifted to the audio range.

The demodulator output is coupled via lead 901 to volume control unit 1,000, which amplifies its input signals in response to microcommands. These microcommands are entered into register 3,400 by processor 3,500 in response to messages from processor 3,600 indicating that the operator depressed the V↑ or V↓ key. Audio amplifier 1,100 amplifies the output of the volume control unit, and the output of the amplifier is coupled to speaker 1,200.

When the operator wishes to transmit on his selected channel, he simply pushes the PTT key on keyboard 3,700. As a result, processor 3,600 sends a message to the slave processor 3,500 via leads 3,510. In response thereto, processor 3,500 generates microcommands which couple the input to filter 700 to the transmit path, and which couple the antenna to the transmit path.

Additionally, processor 3,500 generates microcommands which couple selective call unit 6,300 to the transmit path lead 5,201 via switch 5,200. These microcommands are generated in a sequence such that a frequency of 1,667HZ is first transmitted for a period of several milliseconds. During this time interval, microprocessor 3,500 monitors the magnitude of the forward travelling waves and the reverse travelling waves on antenna 10. This is accomplished by selecting the SWR output by microcommand via analog multiplexer 2,300, and by monitoring the magnitude of the selected signals via leads 2,401.

Note also that during this time period, the receiving transceiver will have its squelch broken, and thus will enable its autolock logic 2,600 via microcommand from processor 3,500. The receiving transceiver monitors the actual frequency transmitted by enabling autolock unit 2,600, by sending microcommands to multiplexer 2300 which select the autolock unit, and by reading signals on leads 2,401. The receiving transceiver then compares the actual frequency of the carrier with the nominal frequency, and makes adjustments to frequency $f_{S2}$ which compensate for any differences. In one embodiment, the receiving unit makes the adjustments by modifying multiplier N5 in clocking module 3,200.

Subsequently, the transmitting unit utilizes the selective call circuitry 6,300 to perform an autocall function (if the operator has so specified via keyboard 3,700). To this end, processor 3,500 generates microcommands which sequentially couple the 1 frequency and the 0 frequency of the selective call unit 6,300 to the transmit path via switch 5,200. Each bit comprising the selective call number is broadcast for only several milliseconds, and thus the entire operation is completed in a fraction of a second. Thus, the SWR monitoring function, the autolock function, and the selective call function are all easily performed between the time that the operator depresses a pushed PTT key and the time in which he begins to speak. After the last bit of the selective call message is transmitted, processor 3,500 generates the microcommand to switch 5,200 which couples signals S52 through the switch thereby enabling speech transmissions. Alternatively, if the operator has specified a digital control message for transmission, then processor 3500 will broadcast the bits of that message following transmission of the selective call number.

Various embodiment of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A communication system comprising:
   (a) a first transceiver including:
      (i) means for transmitting and receiving audio information;
      (ii) digital code receiving means for receiving digitally-formatted code signals;
      (iii) a keyboard device;
      (iv) digital processor means coupled to said keyboard device and responsive thereto, said digital processor including:
         (1) memory means for storing a digital code,
         (3) input means coupling said digital processor to said digital code receiving means,
         (3) comparator means for comparing code signals received via said digital code receiving means with the code stored in said memory means; and
      (v) means coupled to said digital processor means responsive to the results generated by said comparator means for activating a preselected portion of said first transceiver when a received code matches the code stored in said memory means; and
   (b) a second transceiver including:
      (i) means for transmitting and receiving audio information;
      (ii) digital code transmitting means for transmitting a digital code signal;
      (iii) a keyboard device;
      (iv) digital processor means coupled to said keyboard device, said digital processor means being responsive to selective keyboard actuation for transmitting coded signals entered via said keyboard by means to said digital code transmitting means; wherein,
   (c) a code signal transmitted by said second transceiver and received by said first transceiver which compares to a digital code stored in the memory means of said first transceiver activates said predetermined portion of said first transceiver.

2. A communication system according to claim 1, wherein said predetermined portion of said transceiver includes a loudspeaker device.

3. The communication system according to claim 1 wherein the digital processor means of said first transceiver includes memory means for storing a plurality of said digital codes which are respectively assigned to a plurality of frequency channels, said comparator means for selectively comparing code signals received via said digital code receiving means with a selected one of said stored digital codes in dependence upon the particular frequency channel over which a code signal is received.

4. The communication system according to claim 1 wherein the digital code transmitting means of said second transceiver includes:
   (a) signal generating means for generating signals of first and second frequencies;
   (b) means coupled to the digital processor means of said second transceiver for selectively coupling the signals of said first and second frequencies to said means for transmitting and receiving audio information for selective transmission of signals of said first and second frequencies for predetermined time periods, said digitally-formatted code consisting of a series of binary 1's and 0's indicated by transmission of signals of said first and second frequencies, respectively.

5. The communication system according to claim 4 wherein said first frequency is 1667 Hz and said second frequency is 833 Hz.

6. The communication system according to claim 1 wherein said first transceiver includes:
   (a) antenna means for receiving radio wave signals containing audio information and coded frequency sequences thereon;
   (b) frequency measuring means coupled to said antenna means for receiving said frequency sequences therefrom, said frequency measuring means being coupled to the digital processor means of said first transceiver, said digital processor means including means responsive to said frequency sequences for generating binary count sequences which are indicative of said digitally-formatted code in response to control signals received from such digital processor means.

7. The communication system according to claim 6 wherein said frequency measuring means is comprised of:
   (a) voltage level detecting means for converting frequency sequences received from said antenna means into digital signal sequences of the same period as said frequency sequences;
   (b) a digital counter; and
   (c) control means having inputs coupled to simultaneously receive said digital signal sequences from said voltage level detecting means and said control signals from said digital processor means for generating in response thereto logic signals for activating said digital counter for a predetermined number of said periods in response to said control signals.

8. A communication system according to claim 1 wherein said digitally-formatted code signals include a selective call number identifying the transceiver to be activated and a digital control message and wherein said first transceiver includes means coupled to said digital processor means and responsive to the results generated by said comparator means for selectively activating and deactivating an external controllable device in accordance with a received digital control message whenever said predetermined portion of said first transceiver has been activated.

9. The communication system according to claim 8 wherein the digital processor means of said first transceiver includes means for interpreting received digitally-formatted code signals as selective call numbers and as digital control messages.

10. A transceiver comprising:
   (a) means for transmitting and receiving analog information signals;
   (b) digital code receiving means for receiving digitally-formatted code signals;
   (c) digital code transmitting means for transmitting digitally-formatted code signals;
   (d) a keyboard device;
   (e) digital processor means coupled to said keyboard device and responsive thereto, said digital processor means including:
      (i) memory means for storing a digital code entered via said keyboard device;
      (ii) input means coupling said digital processor to said digital code receiving means;

(iii) comparator means for comparing code signals received by said digital code receiving means with the code stored in said memory means; and (iv) output means coupling said digital processor means to said digital code transmitting means, said digital processor means being responsive to selective keyboard actuation for transmitting coded signals entered via said keyboard by means of said digital code transmitting means; and (f) means coupled to said digital processor means and responsive to the results generated by said comparator means for activating a preselected portion of said transceiver; wherein (g) a digital code received by said transceiver which matches a digital code stored in the memory means thereof will activate said predetermined portion of said transceiver; and wherein (h) said keyboard is activatable for transmitting digital codes via the digital code transmitting means thereof to activate respective predetermined portions of other such transceivers.

11. The transceiver according to claim 10, wherein said predetermined portion of said transceiver includes a loudspeaker device.

12. The transceiver according to claim 10, wherein said digital processor means includes:

(a) a programmed ROM containing a stored instruction set for controlling the operation of the transceiver;

(b) an arithmetic/logic unit for performing arithmetic and logic operations on data according to said instruction set;

(c) a RAM memory means for temporarily storing data as said data is being processed by said digital processor;

(d) at least one set of input terminals; and (e) at least one set of latched output terminals, said keyboard device having an array of keys selectively coupled to at least one of said input terminals and to a plurality of said output terminals for entering coded information into said digit processor in dependence upon the state of the keys thereof.

13. The transceiver according to claim 12, wherein said digital processor means is integrated on a single semiconductor substrate.

14. A transceiver comprising:

(a) means for transmitting and receiving analog information signals;

(b) digital code receiving means for receiving digitally-formatted code signals;

(c) digital code transmitting means for transmitting digitally-formatted code signals;

(d) a keyboard device;

(e) a digital processor means coupled to said keyboard device and responsive thereto, said digital processor means including:

(i) random access memory means for temporarily storing data as said data is being processed by said digital processor, at least one register of said memory means for storing a digital code entered via said keyboard device;

(ii) input means coupling said digital processor to said digital code receiving means;

(iii) a programmed ROM containing a permanently-stored instruction set for controlling the operation of the transceiver;

(iv) an arithmetic/logic unit for performing arithmetic and logic operations on data according to said instruction set, said arithmetic/logic unit including comparator means for comparing code signals received by said digital code receiving means with the code stored in the at least one register of said memory means; and (v) output means coupling said digital processor means to said digital code transmitting means, said digital processor means being responsive to selective keyboard actuation for transmitting coded signals entered via said keyboard by means of said digital code transmitting means;

(f) means coupled to said digital processor means and responsive to the results generated by said comparator means for activating a preselected portion of said transceiver wherein;

(g) a digital code received by said transceiver which matches a digital code stored in the memory means thereof will activate said predetermined portion of said transceiver; and wherein, (h) said keyboard is activatable for transmitting digital codes via the digital code transmitting means of said transceiver to selectively activate respective predetermined portions of other such transceivers.

15. The transceiver according to claim 14, wherein said digital processor means is integrated on a single semiconductor substrate.

* * * * *